US012757765B2

(12) United States Patent
Chiu et al.

(10) Patent No.: US 12,757,765 B2
(45) Date of Patent: Oct. 6, 2026

(54) SEMICONDUCTOR PACKAGES, SEMICONDUCTOR DEVICE AND METHOD FOR MANUFACTURING A SEMICONDUCTOR PACKAGE

(71) Applicant: SERIPHY TECHNOLOGY CORPORATION, Hsinchu County (TW)

(72) Inventors: Tzu-Wei Chiu, Hsinchu County (TW); Chun-Wei Chang, Taipei City (TW); Wei-Chih Chen, Taoyuan City (TW); Che-Yen Huang, Hsinchu County (TW)

(73) Assignee: SERIPHY TECHNOLOGY CORPORATION, Hsinchu County (TW)

(*) Notice: Subject to any disclaimer, the term of this patent is extended or adjusted under 35 U.S.C. 154(b) by 565 days.

(21) Appl. No.: 18/353,769

(22) Filed: Jul. 17, 2023

(65) Prior Publication Data

US 2024/0243068 A1 Jul. 18, 2024

Related U.S. Application Data

(60) Provisional application No. 63/479,582, filed on Jan. 12, 2023.

(51) Int. Cl.
*H01L 23/538* (2006.01)
*H01L 23/498* (2006.01)
(Continued)

(52) U.S. Cl.
CPC ............ *H10W 70/65* (2026.01); *H10B 80/00* (2023.02); *H10W 70/05* (2026.01);
(Continued)

(58) Field of Classification Search
CPC .. G06F 13/28; G06F 13/1668; G06F 9/30043; H10B 80/00; H10B 12/50;
(Continued)

(56) References Cited

U.S. PATENT DOCUMENTS

2014/0203429 A1* 7/2014 Yu ........................... H01L 21/78
257/737
2017/0018510 A1* 1/2017 Shen ................. H01L 23/49838
(Continued)

*Primary Examiner* — Lawrence C Tynes, Jr.
(74) *Attorney, Agent, or Firm* — WPAT, P.C.; Anthony King

(57) ABSTRACT

The present application discloses a semiconductor package, a semiconductor device, and a method for manufacturing a semiconductor package. The semiconductor package includes a silicon interposer, a redistribution layer (RDL) formed on the silicon interposer, and a plurality of computation nodes disposed on the RDL. Each of the computation nodes includes a computation dies and a plurality of high bandwidth memory dies. Each adjacent computation nodes can be coupled to each other through the RDL. The silicon interposer is a silicon wafer, and the semiconductor package is a wafer level package (WLP). Therefore, the computing power of the plurality of computation nodes can be embedded within one package, thereby achieving a system on wafer (SoW) that has greater computation capability within a smaller area.

20 Claims, 6 Drawing Sheets

(51) Int. Cl.
*H01L 25/065* (2023.01)
*H10B 80/00* (2023.01)
*H10W 70/05* (2026.01)
*H10W 70/60* (2026.01)
*H10W 70/63* (2026.01)
*H10W 70/65* (2026.01)
*H10W 70/685* (2026.01)
*H10W 90/00* (2026.01)
*H10W 72/00* (2026.01)
*H10W 74/15* (2026.01)

(52) U.S. Cl.
CPC ........ *H10W 70/095* (2026.01); *H10W 70/611* (2026.01); *H10W 70/635* (2026.01); *H10W 70/685* (2026.01); *H10W 90/00* (2026.01); *H10W 90/701* (2026.01); *H10W 72/072* (2026.01); *H10W 74/15* (2026.01); *H10W 90/724* (2026.01); *H10W 90/734* (2026.01)

(58) Field of Classification Search
CPC ........ H10B 12/09; H10B 12/01; H10B 12/00; H10B 10/00; H10B 10/10; H10B 10/18; H01L 24/06; H01L 24/95; H01L 24/96; H01L 24/97
See application file for complete search history.

(56) References Cited

U.S. PATENT DOCUMENTS

2019/0131273 A1* 5/2019 Chen ........................ H01L 25/16
2021/0090983 A1* 3/2021 Lin .................... H01L 23/49866
2023/0352381 A1* 11/2023 Liao .................. H01L 23/49894

* cited by examiner

SEMICONDUCTOR PACKAGES, SEMICONDUCTOR DEVICE AND METHOD FOR MANUFACTURING A SEMICONDUCTOR PACKAGE

CROSS REFERENCE

This application claims the benefit of prior-filed U.S. provisional application No. 63/479,582, filed on Jan. 12, 2023, which is incorporated by reference in its entirety.

TECHNICAL FIELD

The present disclosure relates to a semiconductor package, and more particularly, to a semiconductor package including a plurality of computation nodes.

DISCUSSION OF THE BACKGROUND

As the artificial intellectual (AI) models have been applied to more and more fields, a demand for suitable hardware having greater computation capability also raises. Since the AI models usually require large amounts of parallel computing, most of the computation hardware includes multiple cores, which requires large circuit area. Furthermore, to improve the computation efficiency, data sharing and/or data switching among different cores is also desired. However, to enable data sharing and/or data switching, connections between cores can be complicated and require even larger area. Therefore, providing a semiconductor structure that can facilitate greater computation capability within a smaller area has become an issue to be solved.

SUMMARY

One aspect of the present disclosure provides a semiconductor package. The semiconductor package includes a silicon interposer, a redistribution layer (RDL), a plurality of computation nodes, a plurality of through silicon vias (TSVs), and a plurality of bumps. The RDL is disposed on a first surface of the silicon interposer, and the plurality of computation nodes are disposed on the RDL. Each of the computation nodes includes a computation die. The RDL is disposed between the computation nodes and the silicon interposer. Each of computation dies of the computation nodes incudes a plurality of micro bumps, and the computation dies are bonded to the RDL through the micro bumps. The TSVs pass through the silicon interposer. The plurality of bumps are disposed on a second surface of the silicon interposer and coupled to the RDL through the TSVs. Each two adjacent computation nodes of the computation nodes are coupled to each other through the RDL. From the top view, the RDL includes interconnect structures distributed in portions that overlap the computation nodes and portions free from overlapping the computation nodes.

Another aspect of the present disclosure provides a semiconductor device. The semiconductor device include a printed circuit board (PCB) and the semiconductor package. The semiconductor package is bonded to the PCB through the plurality of bumps.

Another aspect of the present disclosure provides a method for manufacturing a semiconductor package. The method includes receiving a silicon interposer, forming a plurality of through silicon vias (TSVs) within the silicon interposer, forming a redistribution layer (RDL) on a first surface of the silicon interposer, receiving a plurality of computation nodes, disposing the computation nodes on the RDL, grinding a backside the silicon interposer to expose the plurality of TSVs, and forming a plurality of bumps on a second surface of the silicon interposer and coupled to the plurality of TSVs, wherein the bumps are coupled to the RDL through the TSVs. Each of the computation nodes includes a computation die, and each of computation dies of the computation nodes includes a plurality of micro bumps. The step of disposing the computation nodes on the RDL includes bonding the computation dies of the computation nodes to the RDL through the micro bumps, wherein the RDL is between the computation nodes and the silicon interposer. Each two adjacent computation nodes of the computation nodes are coupled to each other through the RDL. From a top view, the RDL includes interconnect structures distributed in portions that overlap the computation nodes and portions free from overlapping the computation nodes.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
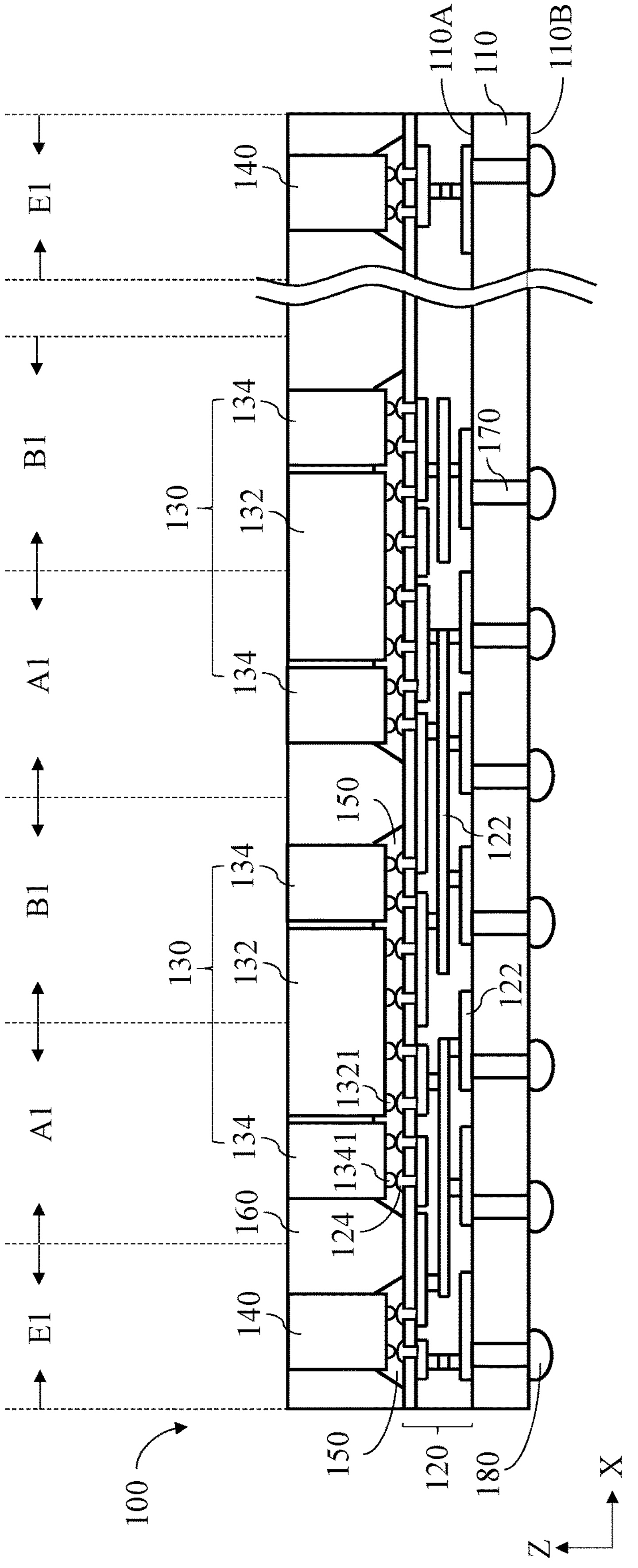
FIG. 1 shows a semiconductor package according to one embodiment of the present disclosure.

FIG. 1 shows a semiconductor package 100 according to one embodiment of the present disclosure. The semiconductor package 100 includes a silicon interposer 110, a redistribution layer (RDL) 120, and a plurality of computation nodes 130. As shown in FIG. 1, the RDL 120 can be disposed on a first surface 110A of the silicon interposer 110, and the computation nodes 130 can be disposed on the RDL 120. That is, the RDL 120 can be disposed between the computation nodes 130 and the silicon interposer 110.

In the present embodiment, each of the computation nodes 130 may include a computation die 132. The computation die 132 can be a system on chip (SoC) that include one or more computation cores. Furthermore, each of computation dies 132 of the computation nodes 130 includes a plurality of micro bumps 1321. The computation dies 132 can be bonded to the RDL 120 through the micro bumps 1321. For example, the micro bumps 1321 can be bonded to conductive contacts 124 formed on the RDL 120. In the present embodiment, each two adjacent computation nodes 130 can be coupled with each other through the RDL 120. Thus, resources of adjacent computation nodes 130 can be shared each other, and the computation data can be transferred between adjacent computation nodes 130.

In some embodiments, each of the computation nodes 130 may be coupled to more than one computation node 130 so as to support a variety of computation flows more flexibly. Since communications between the computation nodes 130 can be achieved by utilizing intra-package traces provided by the RDL 120, the transmission time for resource sharing and data transferring can be shortened, therefore, the computing efficiency can be improved and the power consumption can be reduced.

In the present embodiment, each of the computation nodes 130 may further include a plurality of high bandwidth memory (HBM) dies 134. Each of the HBM dies is disposed on the RDL 120 in close proximity to the computation die 132. In some embodiments, each of the HBM dies can include micro bumps 1341, and the HBM dies can be bonded to the RDL 120 through the micro bumps 1341. For example, the micro bumps 1341 can be bonded to conductive contacts 124 formed on the RDL 120. Therefore, the computing core(s) in the computation dies 132 can access the memory spaces in the HBM dies 134 through the conductive traces provided by the RDL 120.

In the present embodiments, the semiconductor package 100 further includes a plurality of underfills 150 and an encapsulating layer 160 for protecting the computation nodes 130. As shown in FIG. 1, the underfills 150 can fill the gaps between the RDL 120 and the computation nodes 130, and surround the micro bumps 1321 of each of the computation dies 132 and micro bumps 1341 of each of the HBM dies 134.

The encapsulating layer 160 can be disposed on the RDL 120 and surrounding each of the computation nodes 130. In such case, from a top view, the underfills 150 surrounding the computation nodes 130 can be isolated from each other by the encapsulating layer 160. However, the present disclosure is not limited thereto. In some embodiments, the underfills 150 and the encapsulating layer 160 can be replaced by using a molding underfill (MUF) material that can both underfill the gaps between the RDL 120 and the computation nodes 130 and mold the dies of the computation nodes 130 in one process.

Furthermore, as shown in FIG. 1, the semiconductor package 100 further includes a plurality of through silicon vias (TSVs) 170 and a plurality of bumps 180. The TSVs can pass through the silicon interposer 110, and the bumps 180 can be disposed on a second surface 110B of the silicon interposer 110 and coupled to the RDL 120 through the TSVs 170. In the present embodiment, the semiconductor package 100 can be bonded or soldered to a printed circuit board (PCB) through the bumps 180.

In the present embodiment, the semiconductor package 100 further includes a plurality of input/output dies 140. The input/output dies 140 can convert the digital signal generated by the computation nodes 130 into analog signal and transmit the analog signals to external circuits. Also, the input/output dies 140 can convert the analog signal received from external circuits into digital signals, and transmit the digital signals to the computation nodes 130.

Figure 2:
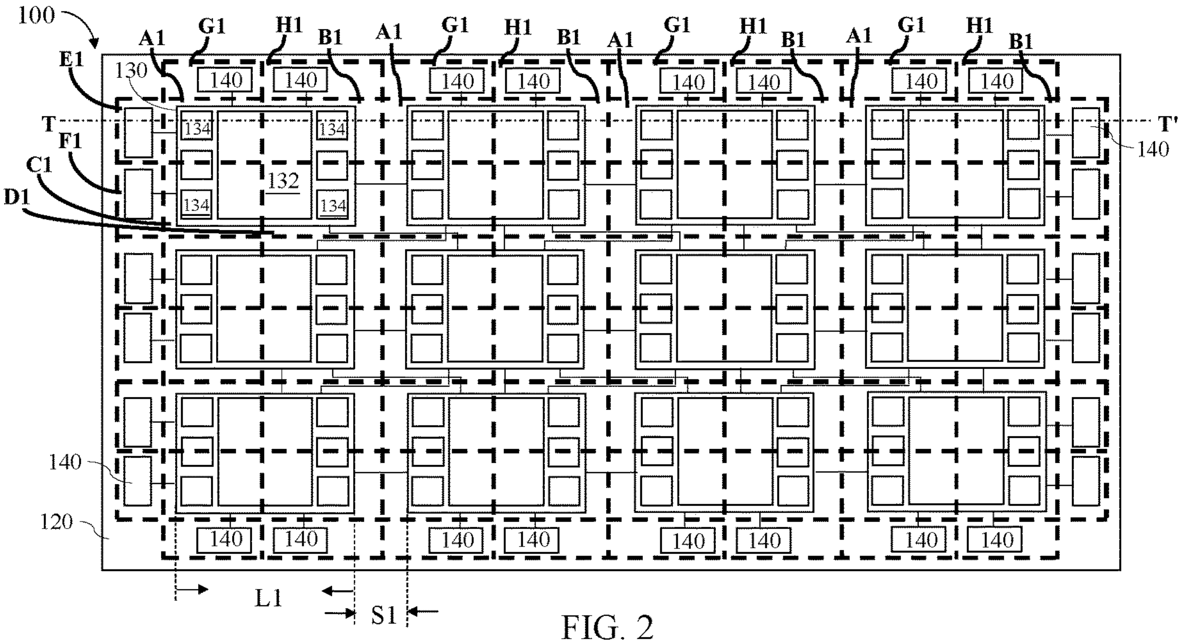
FIG. 2 shows a schematic of the semiconductor package from a top view according to some embodiments of the present disclosure

In the present embodiment, the input/output dies 140 is disposed on the RDL 120 and surrounds the computation nodes 130. FIG. 2 shows a schematic of the semiconductor package 100 from a top view according to some embodiments of the present disclosure without showing the underfills 150 and the encapsulating layer 160 for brevity, and FIG. 1 can be seen as a cross-sectional view of the semiconductor package 100 by cutting along a cutting line T-T' in FIG. 2 with the underfills 150 and the encapsulating layer 160 on top.

As shown in FIG. 2, the computation nodes 130 can be disposed as an array, and the input/output dies 140 can be disposed along the outline of the array. In the present embodiment, each of the computation nodes 130 can be coupled to at least one corresponding input/output die 140 through the RDL 120 for receiving input signals from external circuits and transmitting output signals to external circuits. That is, inside the semiconductor package 100, since the connection trace provided by the RDL 120 is rather stable, computation nodes 130 may communicate with each other with digital signals. In convention, since each WLP includes only one computation die, communication between computation dies of different packages will require digital-analog conversions. Therefore, compared to conventional packages, the semiconductor package 100 allows even faster data sharing among multiple computation dies 132 within the package.

In addition, it may be noted that, in FIG. 2, one computation node 130 can be coupled to eight other neighboring computation nodes 130 at most. In such case, the spaces between each adjacent computation nodes 130 is preserved for accommodate the routing traces for coupling the computation nodes 130. As a result, from the top view, the RDL 120 may include interconnect structures 122 distributed in portions that overlap the computation nodes 130 and portions that is free from overlapping the computation nodes 130.

Furthermore, in the embodiment shown in FIG. 1, the underfills 150 surrounding the computation nodes 130 can be isolated from each other by the encapsulating layer 160. In such case, from the top view, the interconnect structures 122 can be distributed in portions that overlap the computation nodes or the underfills 150 and portions that is free from overlapping the computation nodes and the underfills 150.

In the present embodiment, the semiconductor package 100 can be a wafer level package (WLP), that is, the silicon interposer 110 can be a silicon wafer, and the RDL 120 can be formed on the silicon interposer 110 by semiconductor processes. Therefore, the computing power of the plurality of computation nodes 130 can be embedded within one package, thereby achieving a system on wafer (SoW) that has great computation capability within a small area.

Figure 3:
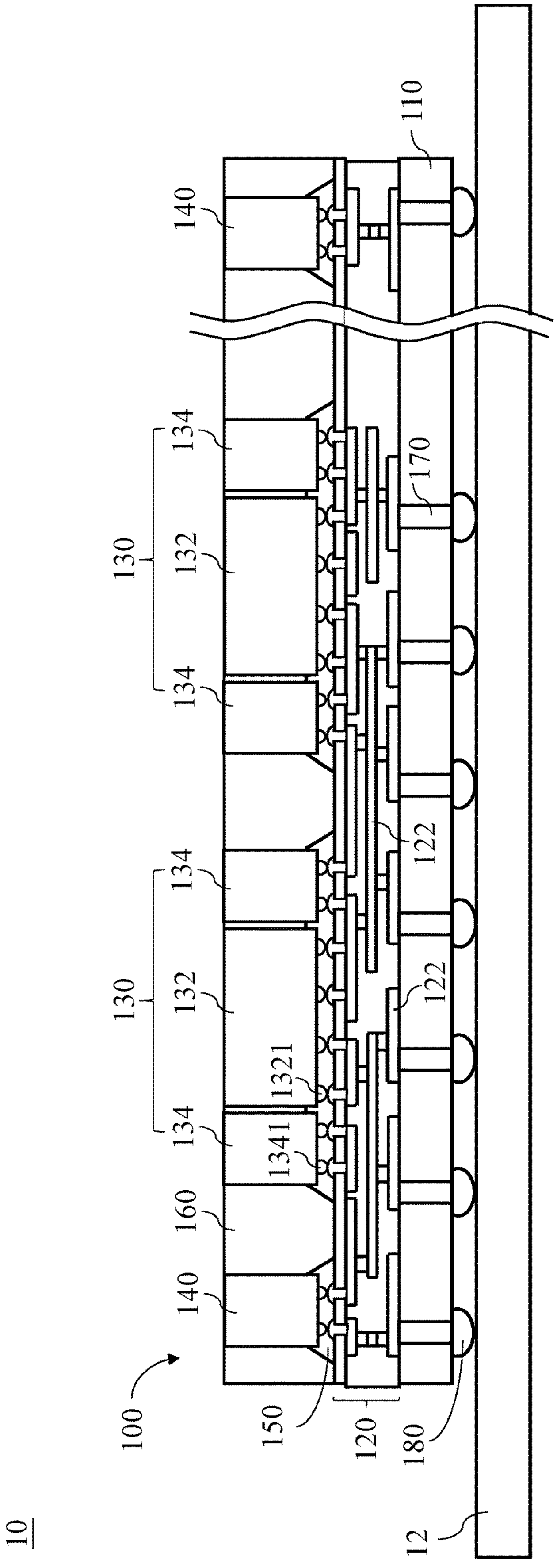
FIG. 3 shows a semiconductor device according to some embodiments of the present disclosure.

FIG. 3 shows a semiconductor device 10 according to some embodiments of the present disclosure. As shown in FIG. 3, the semiconductor device 10 can include the semiconductor package 100 and a PCB 12, and the semiconductor package 100 can be bonded to the PCB 12 through the bumps 180.

Figure 4:
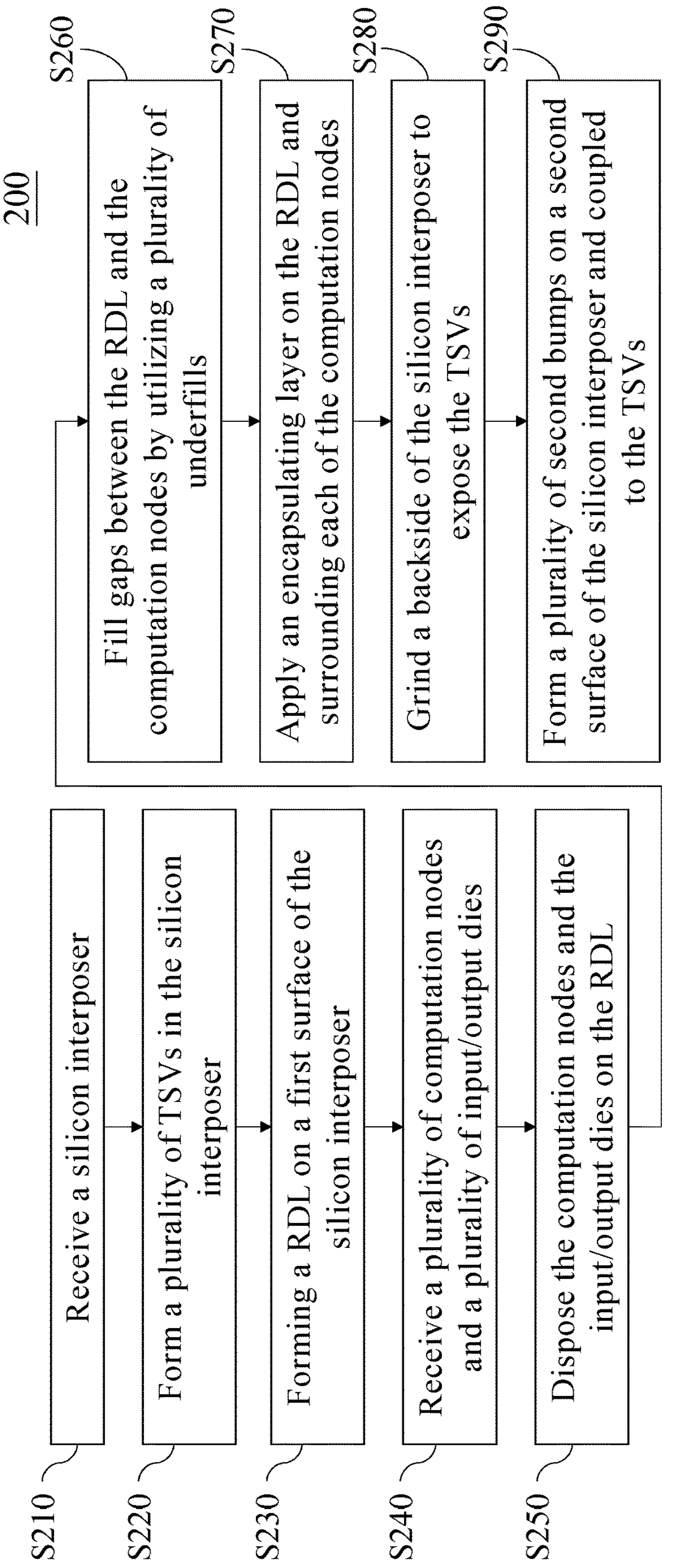
FIG. 4 shows a flow chart of a method for manufacturing the semiconductor package in FIG. 1 according to one embodiment of the present disclosure.

FIG. 4 shows a flow chart of a method 200 for manufacturing the semiconductor package 100 according to one embodiment of the present disclosure. In the present embodiment, the method 200 includes steps S210 to S290 but is not limited to the order shown in FIG. 4.

Figure 5:
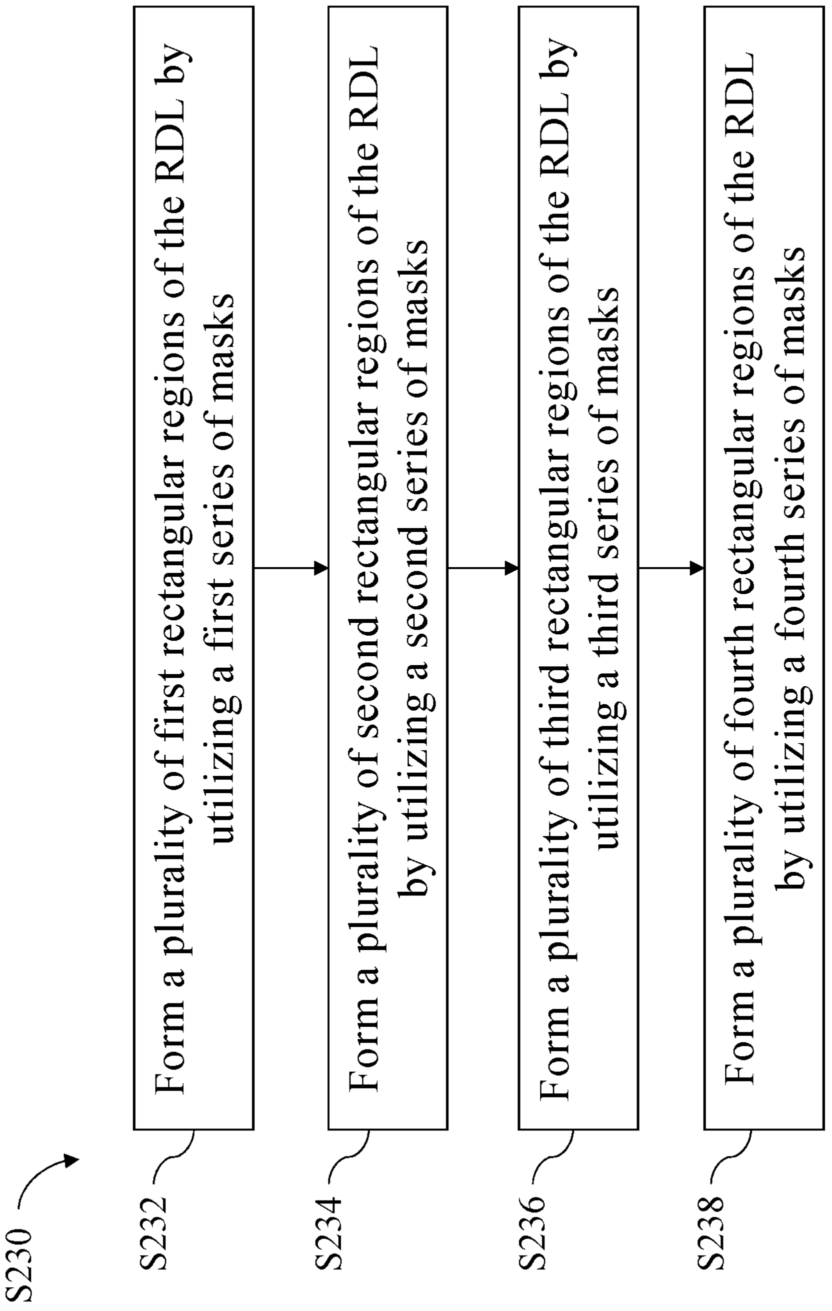
FIG. 5 shows sub-steps of step for forming the RDL in FIG. 1 according to one embodiment of the present disclosure.

According to method 200, the silicon interposer 110 is received in step S210, and the TSVs 170 can be formed in the silicon interposer 110 in step S220. After the TSVs 170 are formed, the RDL 120 can be formed on the first surface 110A of the silicon interposer 110 in step S230 so that the RDL 120 can be coupled to the TSVs 170. In some embodiments, to form the RDL 120 distributed over a large area for providing conductive paths connecting computation nodes, the step S230 may be performed with a mask stitching technique. FIG. 5 shows sub-steps of step S230 for forming the RDL 120 according to one embodiment of the present disclosure.

As shown in FIG. 5, step S230 includes sub-steps S232, S234, S236, and S238. In each sub-steps S232, S234, S236, and S238, a specific series of masks is adopted to form interconnect structures in corresponding regions of the RDL 120. For example, as shown in FIG. 2 the RDL 120 may include different regions A1, B1, C1, and D1 that are formed by utilizing different series of masks. To be more specific, the plurality of first rectangular regions A1 can be formed by utilizing a first series of masks in sub-step S232, the plurality of second rectangular regions B1 can be formed by utilizing a second series of masks in sub-step S234, the plurality of third rectangular regions C1 can be formed by utilizing a third series of masks in sub-step S236, and the plurality of fourth rectangular regions D1 can be formed by utilizing a fourth series of masks in sub-step S238.

In some embodiments, the four series of masks are adopted for lithography in an interactive manner. For example, to pattern a photoresist layer or an inter-layer insulating layer of the RDL 120, a first mask of the first series of masks is applied to expose patterns on the regions A1, and then a first mask of the second series of masks is applied to expose patterns on the regions B1. Sequentially, a first mask of the third series of masks is applied to expose patterns on the regions C1, and then a first mask of the fourth series of masks is applied to expose patterns on the regions D1. After the patterns are exposed on the regions A1, B1, C1, and D1, a solvent may be applied on the photoresist layer or the inter-layer insulating layer to develop the desired patterns of the RDL 120. Similarly, a second mask of the first series of mask, a second mask of the second series of mask, a second mask of the third series of mask, and a second mask of the fourth series of mask can be utilized sequentially to pattern a next photoresist layer or a next insulating layer, and so on.

In the present embodiment, since all the regions A1 are formed by the same series of masks, the first rectangular regions A1 will have same sizes and same patterns of interconnect structures 122. Similarly, the second rectangular regions B1 will have same sizes and same patterns of interconnect structures 122, the third rectangular regions C1 will have same sizes and same patterns of interconnect structures 122, and the fourth rectangular regions D1 will have same sizes and same patterns of interconnect structures 122.

In addition, as shown in FIG. 2, the regions A1, B1, C1 and D1 are arranged in a stagger manner. That is, each of the first rectangular regions A1 is adjacent to at least one rectangular region B1 and at least one third rectangular regions C1. Also, each of the second rectangular regions B1 is adjacent to at least one rectangular region A1 and at least one fourth rectangular regions D1.

In addition, as shown in FIG. 2, from the top of view, each of the computation nodes 130 may overlap a rectangular region A1, a rectangular region B1, a rectangular region C1, and a rectangular region D1.

Similarly, the RDL 120 may further includes rectangular regions E1, F1, G1, and H1 surrounding the first rectangular regions A1, B1, C1 and D1. The rectangular regions E1, F1, G1, and H1 may be formed by utilizing a fifth series of masks, a sixth series of masks, a seventh series of masks, and an eighth series of masks respectively. Therefore, the rectangular regions E1 may have same sizes and same patterns of interconnect structures 122, the rectangular regions F1 may have same sizes and same patterns of interconnect structures 122, the rectangular regions G1 may have same sizes and same patterns of interconnect structures 122, and the rectangular regions H1 may have same sizes and same patterns of interconnect structures 122, In the present embodiments the input/output dies 140 may be disposed on the rectangular regions E1, F1, G1, and H1 correspondingly.

In some embodiments, the sizes of the masks used to form the computation dies 132 and the first rectangular regions A1, B1, C1, and D1 may be substantially the same. For example, the computation dies 132 and the regions A1, B1, C1, and D1 may all have sizes around 26 mm×33 mm. However, by stitching different series of masks, the total area of the semiconductor package 100 can be 200 mm×200 mm or even larger.

Furthermore, in some embodiments, to accommodate the interconnect structures 122 used for connections between the computation nodes 130, adjacent computation nodes 130 may be disposed by a certain spacing. For example, a spacing between each adjacent computation nodes 130 may be greater than one third of a length of each computation node 130. As shown in FIG. 2, the length L1 of the computation node 130 may be 48 mm while the space S1 between adjacent computation nodes 130 may be 18 mm. Furthermore, between each two adjacent computation nodes, no seal rings or scribe lines are disposed, so that the two adjacent computation nodes can be coupled through conductive paths provided by the RDL 120 without obstacles.

In addition, to ensure the integrity of the conductive paths that cross boundaries between two different regions formed by different series of masks, certain design rules may be followed. For example, as shown in FIG. 1, the interconnect structures 122 of the RDL 120 may include conductive traces 1221 that extend along a horizontal direction X and vias 1222 that extend along a vertical direction Z. In such case, the conductive traces that overlap the boundaries between the rectangular regions A1 and B1 from the top view should cross the boundaries perpendicularly. Also, from the top of view, the vias 1222 should be free from overlapping the boundaries of the different rectangular regions.

Figure 6:
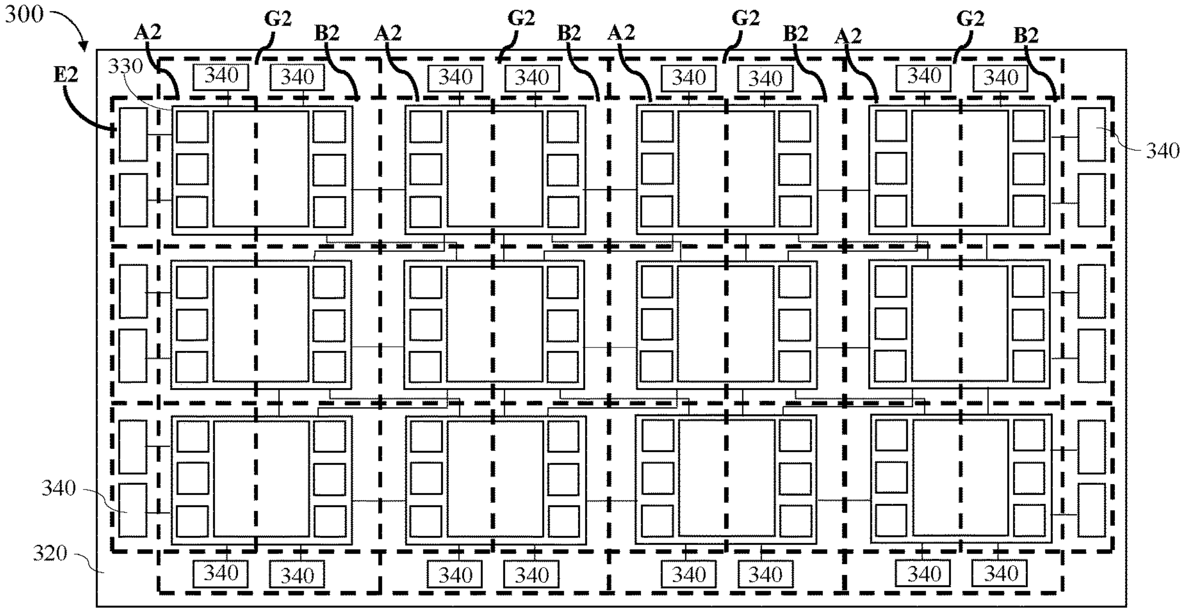
FIG. 6 shows a schematic of the semiconductor package from a top view according to some embodiments of the present disclosure

Although the RDL 120 of the semiconductor package 100 includes eight types of regions A1, B1, C1, D1, E1, F1, G1, and H1 and is formed by stitching eighth series of masks, the present disclosure is not limited thereto. FIG. 6 shows a schematic of the semiconductor package 300 from a top view according to some embodiments of the present disclosure. The semiconductor package 300 and the semiconductor package 100 have similar structures, however, the RDL 320 of the semiconductor package 300 includes only four types of rectangular regions A2, B2, E2 and G2 instead of eight types of rectangular regions A1, B1, C1, D1, E1, F1, G1, and H1 in the RDL 120 of the semiconductor package 100. That is, the RDL 320 can be formed by stitching four different series of masks so as to form the four rectangular regions A2, B2, E2 and G2 correspondingly.

In such case, from the top view, each of the computation nodes 230 may overlap one rectangular region A2 and one rectangular region B2. Also, the input/output dies 140 may be each disposed in a rectangular region E2 or G2. Furthermore, in some embodiments, the RDL may be formed by stitching by even more series of masks (e.g. more than eight), according to the needs.

After the RDL 120 is formed, the computation nodes 130 including the computation dies 132, the HBM dies 134 can be received in steps S240. Also, as shown in FIG. 4, the input/output dies 140 can be received in step S240. In some embodiments, the computation dies 132, the HBM dies 134, and the input/output dies 140 may be manufactured by different factories and may be received separately, but the present disclosure is not limited thereto. In step S250, the computation nodes 130 can be disposed on the RDL 120 by disposing each of the computation dies 132 and disposing HBM dies 134 around each of the computation dies 132, thereby assembling each of the computation nodes 130. In addition, the input/output dies 140 can be disposed on the RDL 120 and surround the computation nodes 130 in step S250.

In step S260, gaps between the RDL 120 and the computation nodes 130 can be filled by utilizing a plurality of underfills 150 that surrounds the micro bumps 1321 of each of the computation dies 132 and the micro bumps 1341 of each of the HBM dies 134. In step S270, an encapsulating layer 160 can be applied on the RDL 120 and surrounding each of the computation nodes 130. In some embodiments, from the top view, the underfills 150 surrounding the computation nodes 130 can be isolated from each other by the encapsulating layer 160. Furthermore, in the present embodiment, the encapsulating layer 160 can be grinded to expose the backsides of the computation dies 132, the HBM dies 134, and the input/output dies 140 so as to reduce the thickness of the semiconductor package 100. However, the present disclosure is not limited thereto.

In step S280, the backside of the silicon interposer 110 is grinded so as to expose the TSVs 170, and thus, in step S290, the bumps 180 can be formed on the second surface 110B of the silicon interposer 110 and coupled to the TSVs 170. In the present embodiment, the bumps 180 can be coupled to the RDL 120 through the TSVs 170. As a result, the semiconductor package 100 can be formed.

In summary, the semiconductor packages, the semiconductor devices and the method for manufacturing the semiconductor packages can include a plurality of computation nodes in a wafer level package (WLP) so as to allow fast data sharing between different computation nodes and support a variety of computation flows more flexibly. As a result, compared to the conventional package, the semiconductor package provided by the embodiments of the present disclosure can achieve greater computation capability within a smaller area.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor package comprising:

a silicon interposer;

a redistribution layer (RDL) disposed on a first surface of the silicon interposer;

a plurality of computation nodes disposed on the RDL, each of the computation nodes comprising a computation die, wherein the RDL is between the computation nodes and the silicon interposer, and each of computation dies of the computation nodes comprises a plurality of micro bumps, and the computation dies are bonded to the RDL through the micro bumps;

a plurality of through silicon vias (TSVs) passing through the silicon interposer;

a plurality of bumps disposed on a second surface of the silicon interposer and coupled to the RDL through the TSVs; and a plurality of input/output dies disposed on the RDL and surrounding the plurality of computation nodes;

wherein:

each two adjacent computation nodes of the computation nodes are coupled to each other through the RDL;

from the top view, the RDL comprises interconnect structures distributed in portions that overlap the computation nodes and portions free from overlapping the computation nodes; and each of the computation nodes is coupled to at least one corresponding input/output die of the input/output dies through the RDL.

2. The semiconductor package of claim 1, wherein from the top view, the RDL comprises a plurality of first rectangular regions and a plurality of second rectangular regions, wherein the first rectangular regions have same sizes and same patterns of interconnect structures, the second rectangular regions have same sizes and same patterns of interconnect structures, and each of the first rectangular regions is adjacent to at least one of the second rectangular regions.

3. The semiconductor package of claim 2, wherein the interconnect structures of the RDL comprise a plurality of conductive traces that overlap boundaries of the first rectangular regions and the second rectangular regions from the top view, and the conductive traces are all perpendicularly crossing the boundaries.

4. The semiconductor package of claim 3, wherein the interconnect structures of the RDL further comprise a plurality of vias, and from the top view, the vias are free from overlapping boundaries of the first rectangular regions and the second rectangular regions.

5. The semiconductor package of claim 2, wherein from the top view, each of the computation nodes overlaps at least one of the first rectangular regions and at least one of the second rectangular regions.

6. The semiconductor package of claim 2, wherein:

from the top view, the RDL further comprises a plurality of third rectangular regions and a plurality of fourth rectangular regions;

the third rectangular regions have same sizes and same patterns of interconnect structures, and the fourth rectangular regions have same sizes and same patterns of interconnect structures;

each of the first rectangular regions is adjacent to at least one of the second rectangular regions and at least one of the third rectangular regions; and each of the second regions is adjacent to at least one of the first rectangular regions and at least one of the fourth rectangular regions.

7. The semiconductor package of claim 6, wherein from the top of view, each of the computation nodes overlaps a first rectangular region of the first rectangular regions, a second rectangular region of the second rectangular regions, a third rectangular region of the third rectangular regions, and a fourth rectangular region of the fourth rectangular regions.

8. The semiconductor package of claim 1, wherein each of the computation nodes further comprises a plurality of high bandwidth memory (HBM) dies, each disposed on the RDL in close proximity to the computation die and coupled to the computation die through the RDL.

9. A semiconductor device comprising:

a printed circuit board (PCB); and a semiconductor package of claim 1 bonded to the PCB through the plurality of bumps.

10. A method for manufacturing a semiconductor package comprising:

receiving a silicon interposer;

forming a plurality of through silicon vias (TSVs) within the silicon interposer;

forming a redistribution layer (RDL) on a first surface of the silicon interposer;

receiving a plurality of computation nodes wherein each of the computation nodes comprises a computation die, and each of computation dies of the computation nodes comprises a plurality of micro bumps;

disposing the computation nodes on the RDL, comprising bonding the computation dies of the computation nodes to the RDL through the micro bumps, wherein the RDL is between the computation nodes and the silicon interposer;

grinding a backside of the silicon interposer to expose the plurality of TSVs; and forming a plurality of bumps on a second surface of the silicon interposer and coupled to the plurality of TSVs, wherein the bumps are coupled to the RDL through the TSVs;

wherein:

each two adjacent computation nodes of the computation nodes are coupled to each other through the RDL; and from a top view, the RDL comprises interconnect structures distributed in portions that overlap the computation nodes and portions free from overlapping the computation nodes;

wherein the step of forming the RDL comprises:

forming a plurality of first rectangular regions of the RDL by utilizing a first series of masks; and forming a plurality of second rectangular regions of the RDL by utilizing a second series of masks;

wherein the first rectangular regions have same sizes and same patterns of interconnect structures, the second rectangular regions have same sizes and same patterns of interconnect structures, and each of the first rectangular regions is adjacent to at least one of the second rectangular regions.

11. The method of claim 10, wherein the interconnect structures of the RDL comprise a plurality of conductive traces that overlap boundaries of the first rectangular regions and the second rectangular regions from the top view, and the conductive traces are all perpendicularly crossing the boundaries.

12. The method of claim 11, wherein the interconnect structures of the RDL further comprise a plurality of vias, and from the top view, the vias are free from overlapping boundaries of the first rectangular regions and the second rectangular regions.

13. The method of claim 10, wherein from the top view, each of the computation nodes overlaps at least one of the first rectangular regions and at least one of the second rectangular regions.

14. The method of claim 10, wherein the step of forming the RDL further comprises: forming a plurality of third rectangular regions of the RDL by utilizing a third series of masks; and forming a plurality of fourth rectangular regions of the RDL by utilizing a fourth series of masks; wherein: the third rectangular regions have same sizes and same patterns of interconnect structures, and the fourth rectangular regions have same sizes and same patterns of interconnect structures; each of the first rectangular regions is adjacent to at least one of the second rectangular regions and at least one of the third rectangular regions; and each of the second regions is adjacent to at least one of the first rectangular regions and at least one of the fourth rectangular regions.

15. The method of claim 14, wherein from the top of view, each of the computation nodes overlaps a first rectangular region of the first rectangular regions, a second rectangular region of the second rectangular regions, a third rectangular region of the third rectangular regions, and a fourth rectangular region of the fourth rectangular regions.

16. The method of claim 10, wherein each of the computation nodes further comprises a plurality of high bandwidth memory (HBM) dies, and the step of disposing the computation nodes on the RDL further comprises bonding the HBM dies of each of the computation nodes to the RDL in close proximity to the computation die of each of the computation nodes.

17. The method of claim 10, further comprising:

receiving a plurality of input/output dies; and disposed the input/output dies on the RDL;

wherein the input/output dies surround the plurality of computation nodes, and each of the computation nodes is coupled to at least one corresponding input/output die of the input/output dies through the RDL.

18. The method of claim 17, wherein the step of forming the RDL comprises:

forming a plurality of fifth rectangular regions of the RDL by utilizing a fifth series of masks; and forming a plurality of sixth rectangular regions of the RDL by utilizing a sixth series of masks;

wherein:

the fifth rectangular regions have same sizes and same patterns of interconnect structures, the sixth rectangular regions have same sizes and same patterns of interconnect structures, each of the fifth rectangular regions is adjacent to at least one of the sixth rectangular regions; and each of the input/output dies is disposed within a fifth rectangular region of the fifth rectangular regions or a sixth rectangular region of the sixth rectangular regions.

19. A semiconductor package comprising:

a silicon interposer;

a redistribution layer (RDL) disposed on a first surface of the silicon interposer;

a plurality of computation nodes disposed on the RDL, each of the computation nodes comprising a computation die, wherein the RDL is between the computation nodes and the silicon interposer, and each of computation dies of the computation nodes comprises a plurality of micro bumps, and the computation dies are bonded to the RDL through the micro bumps;

a plurality of through silicon vias (TSVs) passing through the silicon interposer; and a plurality of bumps disposed on a second surface of the silicon interposer and coupled to the RDL through the TSVs;

wherein:

each two adjacent computation nodes of the computation nodes are coupled to each other through the RDL;

from the top view, the RDL comprises interconnect structures distributed in portions that overlap the computation nodes and portions free from overlapping the computation nodes;

from the top view, the RDL comprises a plurality of first rectangular regions formed with a first series of masks and a plurality of second rectangular regions formed with a second series of masks, and each of the computation nodes overlaps at least one of the first rectangular regions and at least one of the second rectangular regions; and the first rectangular regions have same sizes and same patterns of interconnect structures, the second rectangular regions have same sizes and same patterns of interconnect structures, patterns of the first rectangular regions are different from patterns of the second rectangular regions, and each of the first rectangular regions is adjacent to at least one of the second rectangular regions.

20. The semiconductor package of claim 19, wherein:

from the top view, the RDL further comprises a plurality of third rectangular regions and a plurality of fourth rectangular regions;

the third rectangular regions have same sizes and same patterns of interconnect structures, and the fourth rectangular regions have same sizes and same patterns of interconnect structures;

each of the first rectangular regions is adjacent to at least one of the second rectangular regions and at least one of the third rectangular regions; and each of the second regions is adjacent to at least one of the first rectangular regions and at least one of the fourth rectangular regions.

* * * * *